United States Patent
Sonnichsen

(10) Patent No.: US 6,640,426 B2
(45) Date of Patent: Nov. 4, 2003

(54) INSERTION AND EXTRACTION TOOL

(75) Inventor: Brian E. Sonnichsen, Lake Oswego, OR (US)

(73) Assignee: Xerox Corporation, Stamford, CT (US)

( * ) Notice: Subject to any disclaimer, the term of this patent is extended or adjusted under 35 U.S.C. 154(b) by 421 days.

(21) Appl. No.: 09/783,903

(22) Filed: Feb. 15, 2001

(65) Prior Publication Data

US 2002/0108236 A1 Aug. 15, 2002

(51) Int. Cl.[7] ................................................ B23P 19/00
(52) U.S. Cl. .......................... 29/758; 29/762; 29/764; 29/747; 29/239; 29/270; 29/278; 254/88
(58) Field of Search .................... 29/762, 764, 729, 29/747, 748, 741, 758, 281.5, 283, 239, 242, 270, 278; 254/88, 104

(56) References Cited

U.S. PATENT DOCUMENTS

| | | |
|---|---|---|
| 2,430,011 A | 11/1947 | Gillentine |
| 3,832,764 A | 9/1974 | Fletcher et al. ............... 29/203 |
| 3,846,895 A | 11/1974 | Cosham et al. ............... 29/203 |
| 4,215,468 A | 8/1980 | Greco ........................... 29/764 |
| 4,420,880 A | 12/1983 | Mielke ......................... 29/764 |
| 4,424,625 A | 1/1984 | Callahan ...................... 29/764 |
| 4,468,858 A | 9/1984 | Gulberg et al. ............... 29/764 |
| 4,615,110 A | 10/1986 | Crone .......................... 29/741 |
| 4,619,042 A * | 10/1986 | Halstead |
| 4,756,078 A * | 7/1988 | dougherty et al. |
| 4,805,298 A | 2/1989 | Takahashi ..................... 29/764 |
| 4,817,274 A | 4/1989 | Higgins ........................ 29/764 |
| 4,866,838 A | 9/1989 | Porter .......................... 29/741 |
| 4,868,975 A | 9/1989 | Zaremba et al. .............. 29/741 |
| 4,894,910 A | 1/1990 | Reimer et al. ................ 29/764 |
| 5,046,237 A * | 9/1991 | Conforti et al. |
| 5,062,201 A * | 11/1991 | Long, Jr. |
| 5,214,849 A * | 6/1993 | Jones, Jr. |
| 5,351,391 A * | 10/1994 | Doutrich et al. |
| 5,473,816 A | 12/1995 | Harden, Jr. et al. ........... 29/876 |
| 5,502,887 A | 4/1996 | Gonzales ..................... 29/764 |
| 5,784,774 A | 7/1998 | Kajiwara ..................... 29/758 |

* cited by examiner

Primary Examiner—I Cuda-Rosenbaum
Assistant Examiner—Eric B Compton
(74) Attorney, Agent, or Firm—Philip T. Virga

(57) ABSTRACT

A pin grid array insertion and extraction tool is disclosed that is used to both insert and extract pin grid array connectors. The tool comprises a rigid window frame defined by bars connected to handles wherein the bars define straight slots and ramped slots on an elongated side that engage tabs and sliders of a header and socket of a pin grid array connector. The ramped slots are used to generate mechanical advantage and bring the insertion force seen by an operator's hand down to reasonable levels when engaging or disengaging connector pins to or from their mating receptacles. By using ramped slots the insertion and extraction tool can be made very compact in almost every dimension.

15 Claims, 6 Drawing Sheets

INSERTION AND EXTRACTION TOOL

FIELD OF INVENTION

This invention relates generally to a tool that is used to both insert and extract connectors while maintaining alignment thereof to prevent damage. More specifically, a pin grid array insertion and extraction tool is provided with ramps located within the tool which are used to generate mechanical advantage and bring the insertion force seen by an operator's hand down to reasonable levels so that the tool may be operated with one hand.

BACKGROUND OF THE INVENTION

Pin grid array connectors are generally used to make many electrical connections in a very dense space. While each individual connection requires a small insertion and extraction force, large pin count connectors can involve significant net forces. Additionally, another problem in the challenging aspects of using a pin grid array is in inserting a large number of pins into the sockets without bending or crushing any pins. Due to the delicacy of the pins and the large forces required for actuation of the connector, a tool is often required to enable an operator to safely and effectively close and open the connector. However, prior art tools typically can only be used for removing or extracting a pin-supported package. Also, prior art tools are large and won't easily fit into the tight spaces common to circuit boards. To save costly real-estate on circuit boards and in products, such a tool should be made as compact as possible.

That the above-stated problems have been recognized by others is evident in that attempts to provide tools to specifically solve some of the problems discussed above are shown in U.S. Pat. No. 3,832,764 issued to James C. Fletcher et al; in U.S. Pat. No. 4,424,625 issued to Daniel Callahan; and in U.S. Pat. No. 4,805,298 issued to Ted H. Takahashi. However, none of the devices shown in any of the Patents listed above meet the collective needs which are met by the invention as disclosed herein.

For example, the Fletcher et al Patent discloses a tool for use in lifting a pin-supported, electronic package mounted in juxtaposition with the surface of an electronic circuit board. The tool is configured to be received beneath a pin-supported package and is characterized by a manually operable linkage, including an elongated body within which an elongated, rigid link is supported for axial reciprocation and a pivotal link pinned to the body. A lifting plate is pivotally coupled to the distal end of the pivotal link so that motion imparted to the pivotal link serves to move the plate vertically for elevating the plate into lifting engagement with the electronic package positioned above. However, the Fletcher Patent does not disclose means for inserting a connector and relates only to extractors for removing electronic components from circuit boards.

The Callahan Patent discloses a removal tool for removing strip electrical connectors held in place by friction contact with electrical interconnection ends. The removal tool comprises a pair of spaced apart wall members having inclined plane members associated therewith for engaging the undersurface of the connector to be removed. The removal tool is moved axially along the longitudinal length of the connector forcing the connector away from the support surface thereby sequentially disengaging the electrical interconnecting pins. Although the Callahan Patent discloses a device, which utilizes the wedge principal to impart a prying force to separate electrical connectors, it is unsuitable for use where spatial considerations are paramount. In addition this device may inherently cause the connector pins to be misaligned by the imparting of a torquing moment rather than a normal force.

The Takahashi Patent discloses an extractor for separating electrical connectors by imparting a prying force to connector elements in a plane normal to the mounting surface. The extractor comprises a lever pivotally connected to a rotatable fork that is adapted to fit under the end of a connector shell. A pair of extractors are then deployed at opposite ends of a connector to pry the connector out of its mating. While the Takahashi Patent disclosure recognizes the need for applying a separating force in a plane normal to the connector body and avoid scratching the connector flanges, the extractor is not adapted for tight spatial applications or for insertion and requires the use of both hands.

Other art of interest which disclose various mechanisms for connectors having insertion and/or extraction elements but does not address the problem and is not adaptable for solution of the problem can be found in U.S. Pat. No. 4,215,468 issued to Paul L. Green; in U.S. Pat. No. 4,817,274 issued to Kent R. Higgins, in U.S. Pat. No. 4,866,838 issued to Warren W. Porter, and in U.S. Pat. No. 5,473,816 issued to James A. Harden.

There is therefore a still unsolved need for an apparatus or device that is adaptable for insertion between the flanges of multiple electrical connectors in close proximity to each other that imparts a normal force adequate to cause separation of the connectors without damaging the connectors or the flanges surrounding them. The device should have a small footprint, and be suitable for use with unmounted and mounted connectors and should not be too complicated to use or expensive to make. What is needed, therefore, is a simple and inexpensive tool that both aligns the pins while providing a mechanical advantage to properly insert or extract the connector and also provides a means for actuating high pin count pin grid array connectors and can be used in a wide variety of applications. This need is met by the insertion and extraction tool of the present invention.

SUMMARY OF THE INVENTION

It is an advantage of the present invention to provide a pin grid array insertion and extraction tool that allows an operator to safely and easily insert and extract pin grid array connectors involving large forces and is both compact and removable so that it can be applied to and removed from a connector, even on a crowded circuit board.

It is another advantage of the present invention to provide a pin grid array insertion and extraction tool that that aligns a header and a socket to prevent pin damage and can be operated with only one hand.

It is yet another advantage of the present invention to provide a pin grid array insertion and extraction tool that can also act to hold a pin grid array connector in place and stay permanently attached to the connector thereby adding strength to the connector during insertion/extraction of the connector.

To achieve the foregoing and other aspects, features and advantages, and in accordance with the purposes of the present invention as described herein, the invention is a tool that is used to both insert and extract pin grid array connectors. The tool comprises a rigid window frame defined by elongated bars connected to handles wherein the elongated bars further define straight slots and ramped slots on an elongated side that engage tabs and sliders of the header and socket of a pin grid array connector. The ramped slots are used to generate mechanical advantage and bring the insertion force seen by an operator's hand down to reasonable levels when engaging or disengaging connector pins to or from their mating receptacles. By using ramps the insertion and extraction tool can be made very compact in almost every dimension.

Still other aspects of the present invention will become apparent to those skilled in this art from the following description, wherein there is shown and described a preferred embodiment of this invention by way of illustration of one of the modes best suited to carry out the invention. The invention is capable of other different embodiments and its details are capable of modifications in various, aspects all without departing from the invention. Accordingly, the drawings and descriptions will be regarded as illustrative in nature and not as restrictive. And now for a brief description of the drawings.

DETAILED DESCRIPTION OF THE INVENTION

Figure 1:
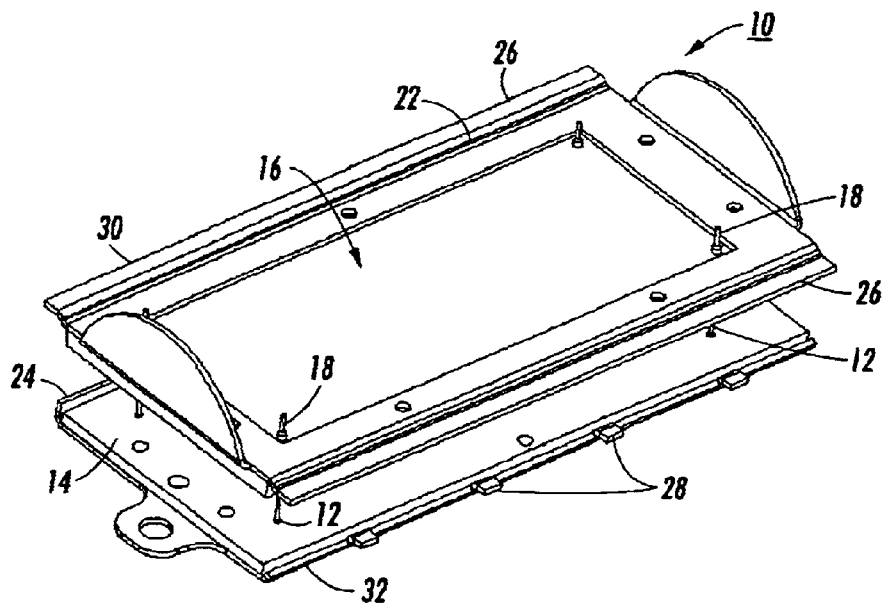
FIG. 1 is a perspective view of two separated portions of a pin grid array connector to be used in association with the tool of the present invention.

Referring now to the drawings wherein like numerals designate like or corresponding parts throughout, there is shown in FIG. 1 a perspective view of two separated portions of a pin grid array connector 10 to be used with the insertion and extraction tool of the present invention. One of the separated portions of the pin grid array connector 10 includes an array of small pins 12, held in a substrate referred to typically as a header 14. The other portion of the pin grid array connector 10 includes a corresponding array of receptacles 18 that mates with the array of small pins 12 and are held in another substrate typically referred to as the socket 16. When mated, each of the one or more pins 12 inserts into receptacles 18 located on the socket 16 with a discrete insertion force, shown before engagement in FIG. 1. Similarly, the same force is required to separate each pin 12 from its receptacle 18. For simplicity, only four pins 12, with corresponding receptacles 18 are shown.

Connected to both the header 14 and socket 16 are frames 24 and 22 respectively, that surround the pin/receptacle array and that extend beyond sides 32 and 30 of each portion of the pin grid array connector 10, as shown in FIG. 1. Along the longest dimension of the side 30 of the socket 16, the frame 22 extends to form an extending edge surface, or 'slider,' 26. Similarly, a discrete number of tabs 28 extend from either side 32 of the frame 24 on the header 14. To fully mate the header 14 with the socket 16, the sum of the forces of each pin-receptacle pair must be applied. Also, additional force may be required to overcome any pin to pin misalignment. When the number of pins in the pin grid array 10 becomes large, the required mating force typically exceeds the capability of an operator's hand. Moreover, so as not to bend any pins 12 during insertion, the header 14 and socket 16 are aligned before insertion and held relatively parallel throughout the insertion procedure which is accomplished by one or more dowel pins as will be more fully discussed below. It should therefore be understood that the tool of the present invention may be used to mate hundreds of pins 12 and receptacles 18 on a single header 14/socket 16 pair.

Figure 2:
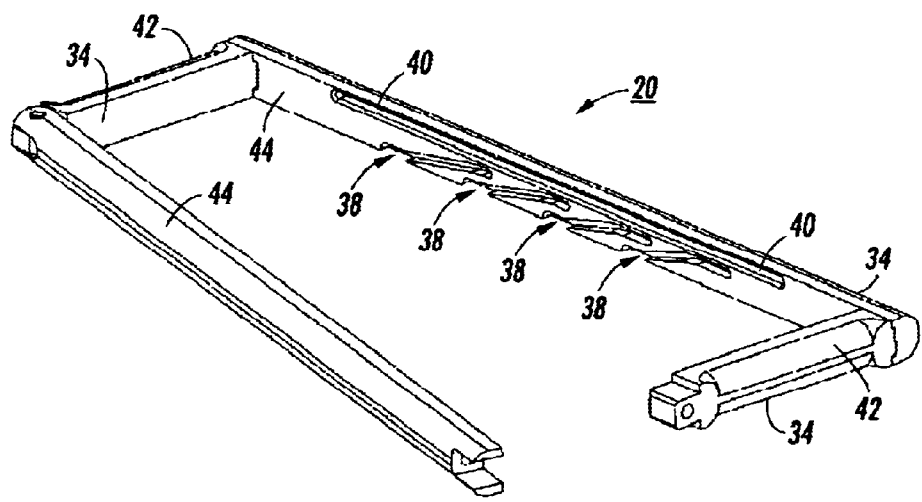
FIG. 2 is a perspective view of the pin grid array insertion and extraction tool of the present invention.
Figure 3:
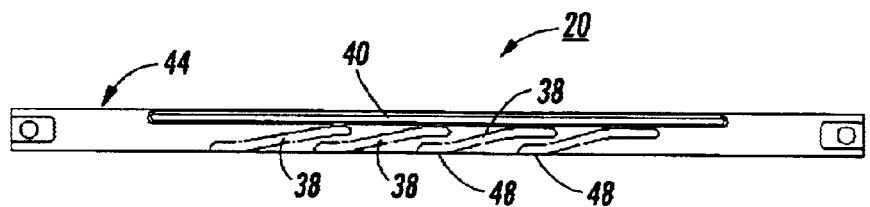
FIG. 3 is a side elevational view of the tool of the present invention viewed from the interior of the frame thereof.

Referring now to FIG. 2, there is shown a perspective view of the insertion and extraction tool 20 of the present invention. The insertion and extraction tool 20 comprises a window frame member 34 defined by a pair of opposed elongated bar members 44 and a pair of opposed handle members 42 secured together at opposed ends thereof to form a substantially rigid structure. Each of the elongated members 44 further define an elongated straight slot 40 and a plurality of ramped slots 38 as shown in FIG. 3. As will be more fully described below, the elongated straight slots 40 and ramped slots 38 engage the tabs 28 and sliders 26 of the header 14 and socket 16 of the pin grid array connector 10 shown in FIG. 1. By way of example but not of limitation, the window frame member 34 may be made of any material such as metal or plastic which gives it a rigid characteristic.

Figure 4:
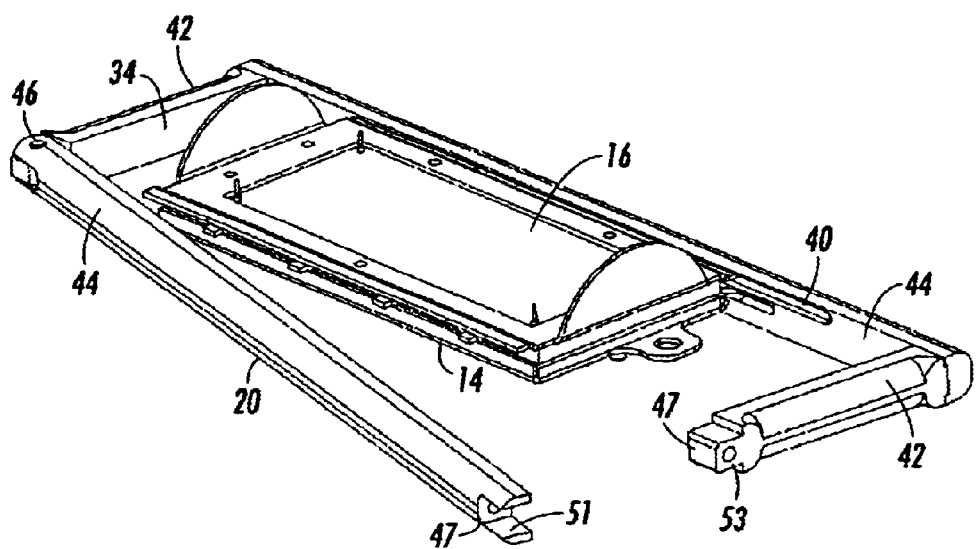
FIG. 4 is a perspective view of the pin grid array connector of FIG. 1 showing the tool alignment in accordance with the present invention.
Figure 5:
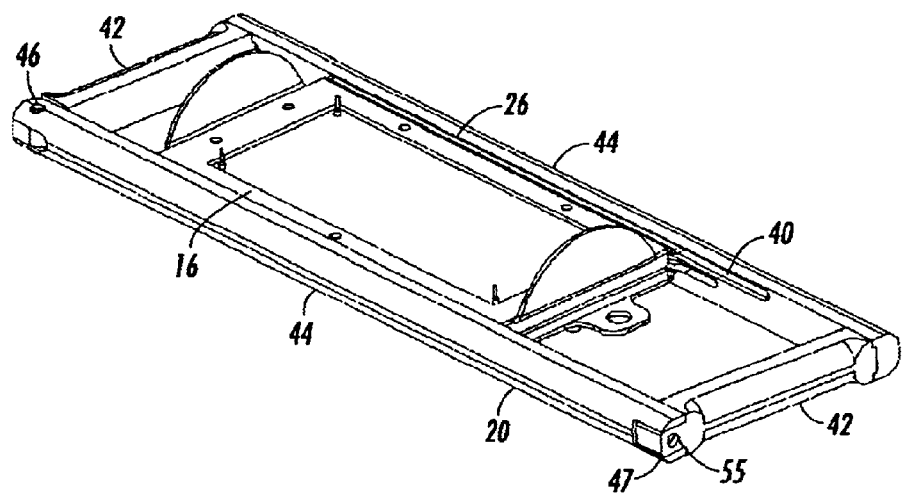
FIG. 5 is a perspective view of the pin grid array connector of FIG. 4 showing final alignment using the tool in accordance with the present invention.
Figure 6:
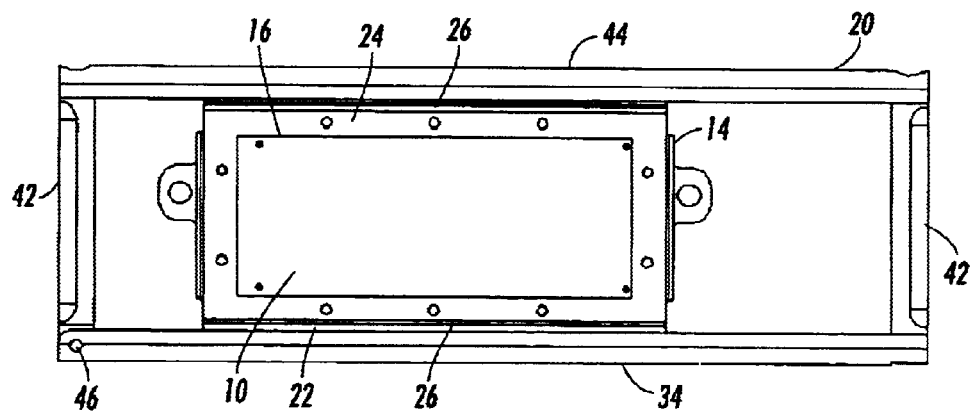
FIG. 6 is a top plan view of the pin grid array connector and tool of FIG. 5.

Referring now to FIGS. 4, 5 and 6, there are shown views of the pin grid array connector 10 illustrating the alignment when using the insertion and extraction tool 20 in accordance with the present invention. As shown in the figures, the window frame's 34 elongated bars 44 and handles 42 completely surround the header 14 and socket 16 combination. As shown, the handles 42 extend across the short dimension of the header 14/socket 16 connecting the elongated bars 44 together to extend along the long dimension of the header 14/socket 16 combination. As explained above, the handles 42 and bars 44 are secured together to form the rigid window frame 34 that fits around the header 14/socket 16 combination. The straight slots 40 defined within the elongated bars 44 accept the sliders 26 on the socket 16, thereby retaining the socket 16 within the window frame 34, as shown in FIGS. 5 and 6. The frame 34 can be slid along the length of the socket 16, but is captured in all other dimensions. To make the insertion and extraction tool 20 removable, one of the long bars 44 of the window frame 34 can be designed to be detachable or hinged 46, thus allowing the header 14/socket 16 pair and insertion and extraction tool 20 to be separated. Although not shown, it may be envisioned that one or more hinge joints for coupling the opposed elongated bar members 44 to one or more of the opposed handle members 42 may be incorporated. Additionally, one or more detachable couplings 47 for permitting detachable engagement between one or more of the opposed elongated bar members 44 to one or more of the opposed handle members 42 is provided for selective engagement/disengagement of the window frame 34. As shown in FIG. 4, the detachable coupling 47 may be provided by a tongue 51 and groove 53 arrangement and secured by a screw or pin 55 as shown in FIG. 5. FIG. 6 shows the header 14 and socket 16 with the frames 24 and 22 attached. Although not shown, it should be understood that the metal frames 24 and 22 might be interchanged between the header 14 and the socket 16 achieving the same connection result.

Figure 7:
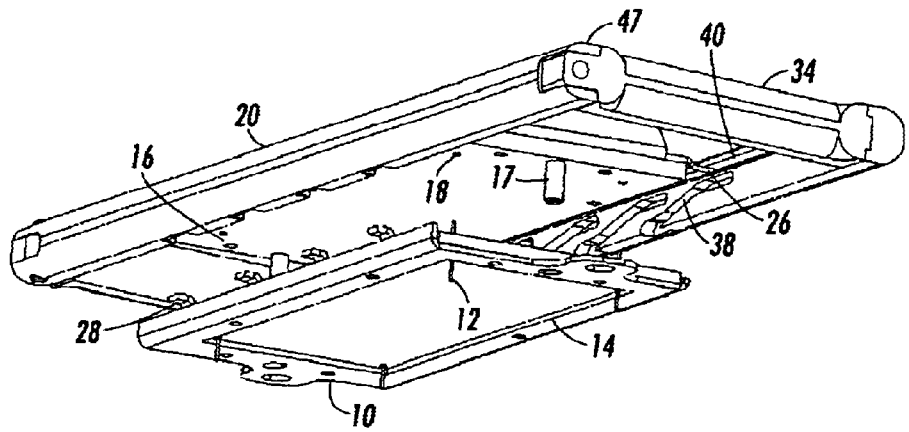
FIGS. 7, 8 and 9 are perspective views showing the method of joining the two separated portions of the pin grid array connector utilizing the pin grid array insertion and extraction tool of the present invention.
Figure 8:
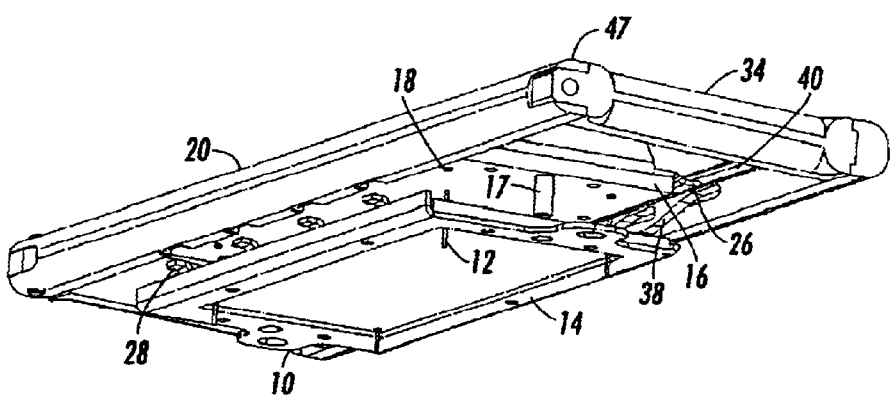
Figure 9:
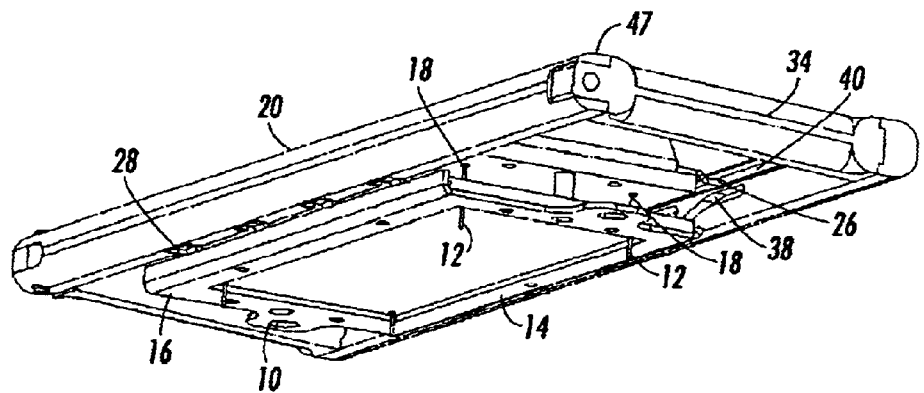
Figure 10:
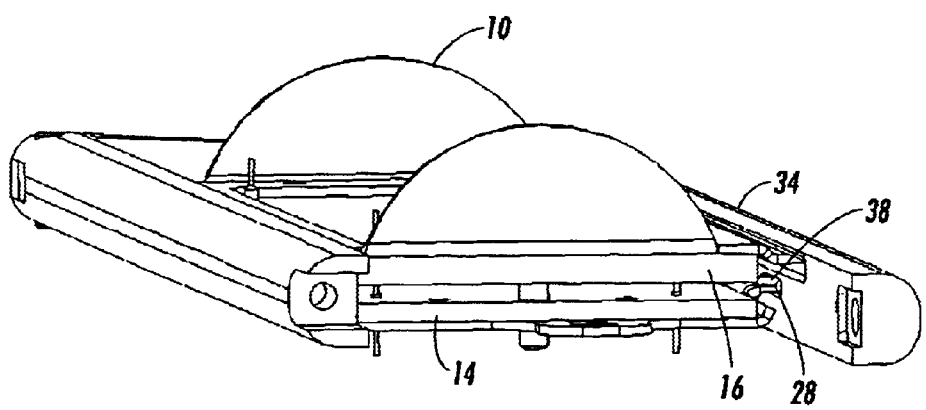
FIGS. 10 and 11 are perspective views of the pin grid array connector of FIG. 1 showing final engagement using the tool in accordance with the present invention.
Figure 11:
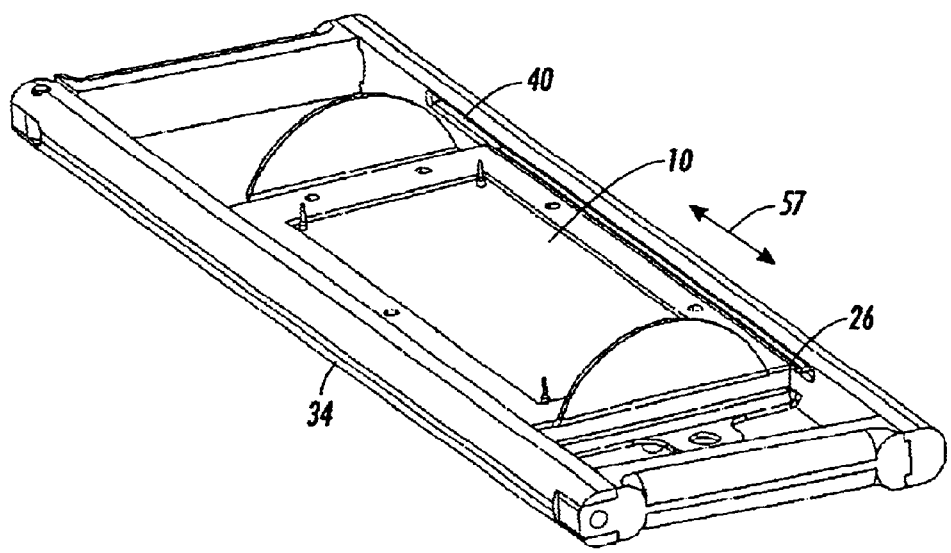

Referring now to FIGS. 7, 8 and 9 there are shown perspective views illustrating the method of joining the two separated portions of the pin grid array connector 10 together utilizing the pin grid array insertion and extraction tool 20 of the present invention. First, the socket 16 is retained within the window frame 34 by having the sliders 26 inserted into the straight slots 40 and the tool 20 selectively engaged at 47 capturing and holding rigidly the socket 16 within the window frame 34. Next, the header 14 is positioned such that its tabs 28 align with the slotted openings 38. The header is then moved into the window frame 34 with the tabs following the angle of the slotted openings 38. Dowel pins 17 contained in the socket 16 fit into tightly tolerance holes in the header 14 and serve to align the pins 12 to the receptacles 18 in the pin grid array 10 as the header 14 is moved close to the socket 16. In operation, as the header 14 is brought closer to the socket 16 and the window frame 34, the tabs 28 around the header 14 slip into the openings 38 on the lower side of the window frame 34 as shown in FIGS. 9 and 10. Next, while securing the socket 16, the window frame 34 is slid along the sliders 26 attached to the socket 16 by an operator's hand (not shown) within the straight slots 40. The tabs 28 on the header 14 slide up the ramped slots 38 in the window frame 34 as the window 34 is moved, forcing the header 14 up against the socket 16. When the window 34 is slid in the opposite direction 57, the tabs 28 are forced to slide down the ramped slots 38, separating the two halves of the pin grid array connector 10.

In accordance with the present invention, the advantage of the ramp is a trade off of actuation force for actuation distance. To gain the mechanical advantage required, shallow slant angles must be used on the ramped slots 38. Therefore, in order to move the header 14 the required distance for insertion, the window frame 34 must be moved a much longer distance. It also follows that a much lower force is required to move the window frame 34 along that distance in order to overcome the large force of insertion and/or extraction. The equation below describes the horizontal force required to move a slider up a ramp against a vertical resisting force.

$$F_a = F_v * (\mu \cos\theta + \sin\theta)/(\cos\theta - \mu \sin\theta)$$

Figure 12:
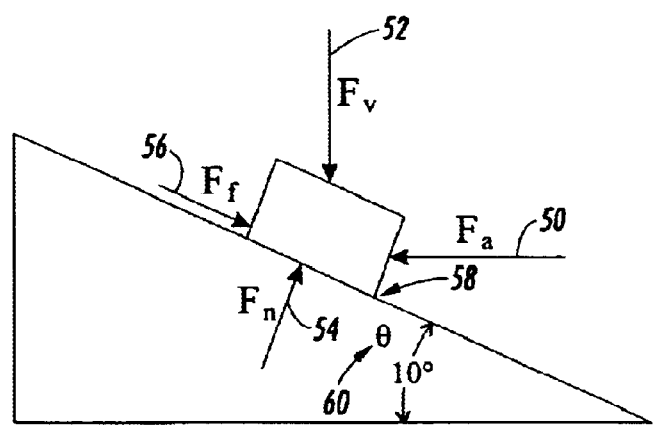
FIG. 12 is a graphical representation of the forces for inserting or extracting the pins used in the pin grid array connector using the tool of the present invention.

FIG. 12 is a graphical representation illustrating the above equation of the forces for inserting or extracting the pins 12 used in the pin grid array connector 10 using the action tool 20 of the present invention. As shown in FIG. 6, $F_a$ 50 is the horizontal force applied to the sliders 26 and $F_v$ 52 is the vertical insertion force seen by the sliders 26. $F_n$ 54 is the normal force to the ramp 38, $F_f$ 56 is the resulting friction force, and $\mu$ 58 is the coefficient of friction. For a 10 pound insertion force, a $\theta$ 60 of 10 degrees, and a $\mu$ of 0.2, a force $F_a$ 50 of 3.9 pounds must be applied to the sliders 26 to move it up the ramps 38. Therefore it should be understood that a ramp can greatly reduce the horizontal force required to overcome a large vertical force. As mentioned above, this mechanical advantage is gained at the cost of actuation distance. Because of the relatively long actuation distance, the insertion and extraction tool 20 must be accordingly longer than the pin grid array connector 10, although it can be made to be near the size of the inserted pin grid array connector 10 in all other dimensions.

A few additional points are to be noted concerning the ramps 38. Several ramp-slot pairs can be located along both long sides of the header 14 so as to distribute the insertion and/or extraction force around the connector 10. Furthermore, each of the ramps 38 can be slanted at a slightly different angle and arranged around the header 14 so that one corner of the pin grid array 10 is fully inserted first and the opposite corner last. Arranging the ramps 38 in this way acts to 'roll' the header 14 into the socket 16 so that the tool 20 acts on the force resulting from only those pins 12 that are engaging at any one time. Another advantage to 'rolling' the connector 10 into place is that pin to pin irregularities are absorbed incrementally. Typically, pins 12 in the pin grid array 10 are bent to some degree and located relative to one another within some known tolerance. Similarly, the sockets 16 are located relative to each other within a tolerance. When the header 14 is forced against the socket, the pins must each bend enough to overcome the misalignment to their corresponding receptacles 18 in addition to overcoming the inherent insertion force associated with engaging the receptacles 18. By inserting the pins 12 incrementally, the individual pin alignments can be spread out in time rather than occurring all at once, greatly reducing the resultant force required to move the window frame 34.

In accordance with the present invention, a tool 20 is disclosed that can be used with one hand which facilitates the insertion and extraction of large insertion force pin grid array connectors 10 while maintaining adequate alignment between pins 12 and receptacles 18 at all times. The tool 20 can also act to hold a connector closed and stay permanently attached. The tool 20 is both compact and easily removable from the pin grid array connector 10. No previous known device serves to both insert and extract large pin count connectors when operated with only one hand. The invention can be removed from the pin grid array after the connector has been mated and can be re-installed on the connector for extraction. By using ramps to actuate the insertion and extraction, the insertion and extraction tool of the present invention is extremely compact and has a footprint not much larger than the connector. Therefore, the driving concept behind the pin grid array insertion and extraction tool is the mechanical advantage gained through ramps.

In summary, through the use of multiple ramps of varying slant angles, the pin grid array insertion and extraction tool allows an operator to safely and easily insert and extract pin grid array connectors involving large forces. The tool aligns the header and socket to prevent pin damage and can be operated with only one hand. As a result of the ramp concept, the tool can be made very compact and therefore helps to save costly space in product applications. The tool also can be made removable so that each pin grid array connector will not include the added bulk and expense of the tool. While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. An insertion and extraction tool comprising:
   a window frame member including a pair of opposed elongated bar members and a pair of opposed handle members secured together at opposed ends thereof to form a substantially rigid structure, each of said elongated members defining an elongated slot and a plurality of ramped slots.

2. The insertion and extraction tool of claim 1, wherein said window frame member further includes:

one or more hinge joints for coupling one or more of said opposed elongated bar members to one or more of said opposed handle members.

3. The insertion and extraction tool of claim 1, wherein said window frame member further includes:

one or more detachable couplings for permitting detachable engagement between one or more of said opposed elongated bar members to one or more of said opposed handle members to provide selective engagement of said window frame.

4. The insertion and extraction tool of claim 1, wherein said window frame member further includes:

said plurality of ramped slots formed at progressively varying angles.

5. The insertion and extraction tool of claim 1, wherein said window frame member further includes:

four ramped slots formed at progressively varying angles.

6. The insertion and extraction tool of claim 1, wherein said window frame member further includes:

said plurality of ramped slots formed at shallow slant angles.

7. The insertion and extraction tool of claim 1, wherein said window frame member further includes:

said pair of opposed elongated bar members having a length greater than said pair of opposed handle members.

8. The insertion and extraction tool of claim 1, wherein said window frame member further includes:

one or more detachable couplings for permitting permanent engagement between one or more of said opposed elongated bar members to one or more of said opposed handle members of said window frame.

9. The insertion and extraction tool of claim 3, wherein said one or more detachable couplings further includes:

using a tongue and groove arrangement.

10. A tool for connection and disconnection of first and second mateable members, comprising:

a first frame for supporting the first mateable member, said first frame including a slider surface extending along opposing edges thereof;

a second frame for supporting the second mateable member, said second frame including a plurality of tab members extending along opposing edges thereof; and a window frame member including a pair of opposed elongated bar members and a pair of opposed handle members secured together at opposed ends thereof to form a substantially rigid structure, each of said elongated members defining:

an elongated slot for receiving said slider surface extending from said first frame; and a plurality of ramped slots for receiving said plurality of tab members extending from said second frame.

11. The tool of claim 10, wherein said window frame member further includes:

a hinge joint for coupling one of said elongated bar members to one of said handle members; and a detachable coupling situated opposite said hinge member for permitting said elongated bar member to pivot in and out of engagement with said first and second frames.

12. The tool of claim 10, wherein said window frame member further includes:

a first detachable coupling for permitting detachable engagement between one of said pair of opposed elongated bar members and a first of said pair of opposed handle members; and a second detachable coupling for permitting detachable engagement between said one of said pair of opposed elongated bar members and a second of said pair of opposed handle members to provide selective engagement between said window frame and said first and second frames.

13. The tool of claim 10, wherein said opposed elongated bar members of said window frame have a length greater than the opposing edges of said first and second frames having the slider surface and the tab members extending therefrom for permitting relative movement therebetween to allow the tab members to travel along said ramped slots.

14. The tool of claim 10, wherein the plurality of ramped slots are formed at progressively varying angles for permitting gradual engagement and disengagement between the first and second mateable members.

15. A pin grid array insertion and extraction tool comprising:

a window frame defined by elongated bars connected by handles;

the elongated bars having straight slots therein for engaging sliders of a pin grid array connector; and the elongated bars further having ramped slots therein for engaging tabs of the pin grid array connector wherein the ramped slots are used to generate mechanical advantage and bring the insertion force seen by an operator's hand down to reasonable levels when engaging or disengaging connector pins to or from their mating receptacles.

* * * * *